United States Patent [19]

Kwasnick et al.

[11] Patent Number: 5,132,745
[45] Date of Patent: Jul. 21, 1992

[54] THIN FILM TRANSISTOR HAVING AN IMPROVED GATE STRUCTURE AND GATE COVERAGE BY THE GATE DIELECTRIC

[75] Inventors: Robert F. Kwasnick; Ching-Yeu Wei, both of Schenectady, N.Y.

[73] Assignee: General Electric Company, Schenectady, N.Y.

[21] Appl. No.: 758,474

[22] Filed: Sep. 6, 1991

Related U.S. Application Data

[63] Continuation of Ser. No. 593,421, Oct. 5, 1990, abandoned.

[51] Int. Cl.⁵ .............................................. H01L 27/12
[52] U.S. Cl. ........................................ 357/4; 357/23.7; 357/71
[58] Field of Search .................... 357/2, 4, 23.7, 68, 357/71

[56] References Cited

U.S. PATENT DOCUMENTS

| | | | |
|---|---|---|---|
| 4,651,185 | 3/1987 | Holmberg et al. | 357/23.7 |
| 4,700,458 | 10/1987 | Suzuki et al. | 437/83 |
| 4,736,289 | 4/1988 | Holmberg et al. | 357/23.7 |
| 4,767,723 | 8/1988 | Hinsberg, III et al. | 357/23.7 |
| 4,778,560 | 10/1988 | Takeda et al. | 357/23.7 |
| 4,975,760 | 12/1990 | Dohjo et al. | 357/67 |
| 4,984,038 | 1/1991 | Sunami et al. | 357/54 |
| 5,010,027 | 4/1991 | Possin et al. | 437/41 |
| 5,036,370 | 7/1991 | Miyago et al. | 357/4 |

FOREIGN PATENT DOCUMENTS 61-172370 8/1986 Japan ..................................... 357/4

OTHER PUBLICATIONS

B. Gorowtiz, R. J. Saia, E. W. Balch, "Methods of Metal Patterning and Etching for VLSI", General Electric Co. Technical Information Series Mar. 1987; also published in VLSI Electronics Microstructure Science (N. Einspruch, S. Cohen, G. Gildenblat Eds). vol. 15, chap. 4, p. 159 (1987).
R. J. Saia, B. Gorowitz, "The Reactive Ion Etching of Molybdenum and Bilayer Metallization Systems Containing Molybdenum", Journal of the Electrochemical Society, vol. 135, pp. 2795-2802 (1988) (See p. 2797 for discussion of one step Mo-Cr etching).

Primary Examiner—Andrew J. James
Assistant Examiner—Courtney A. Bowers
Attorney, Agent, or Firm—Donald S. Ingraham; James C. Davis, Jr.; Marvin Snyder

[57] ABSTRACT

A thin film transistor includes a two-layer gate metallization comprising a relatively thin first layer of a first conductor and a relatively thick second layer of a second conductor with the second conductor being capable of being etched with an etchant that produces substantially no etching of the first conductor layer. During device fabrication, the thick gate metallization layer (second conductor) is selectively etched until all of that material is removed in the openings in the mask. The thin lower layer (first conductor) is then etched with a minimum of etching into the substrate. The gate dielectric and subsequent layers deposited over this gate metallization have high integrity and highly reliable continuity because of the sloped nature of the gate metallization sidewalls, and because of the shallow gate metallization topography due to minimization of substrate etching during gate metallization patterning.

5 Claims, 5 Drawing Sheets

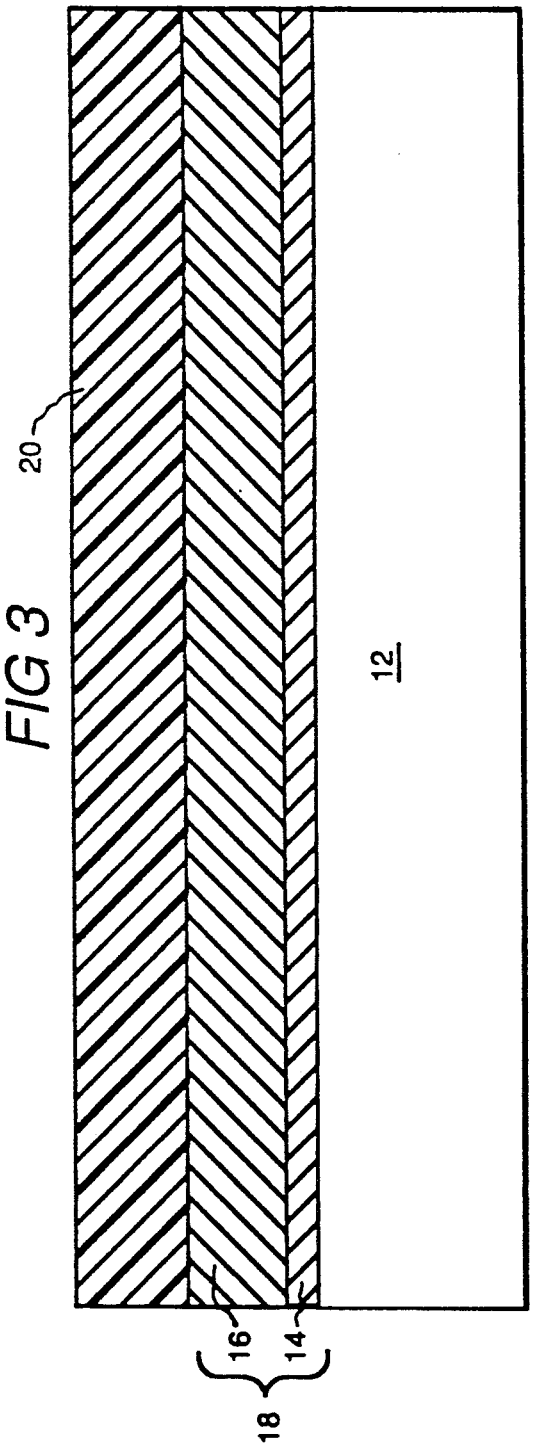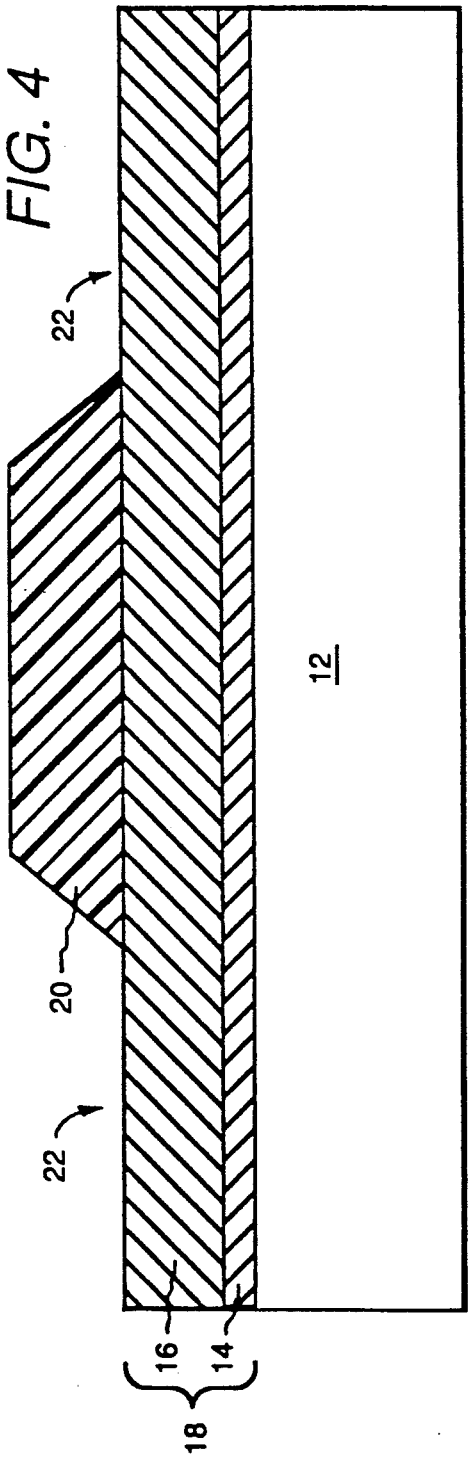

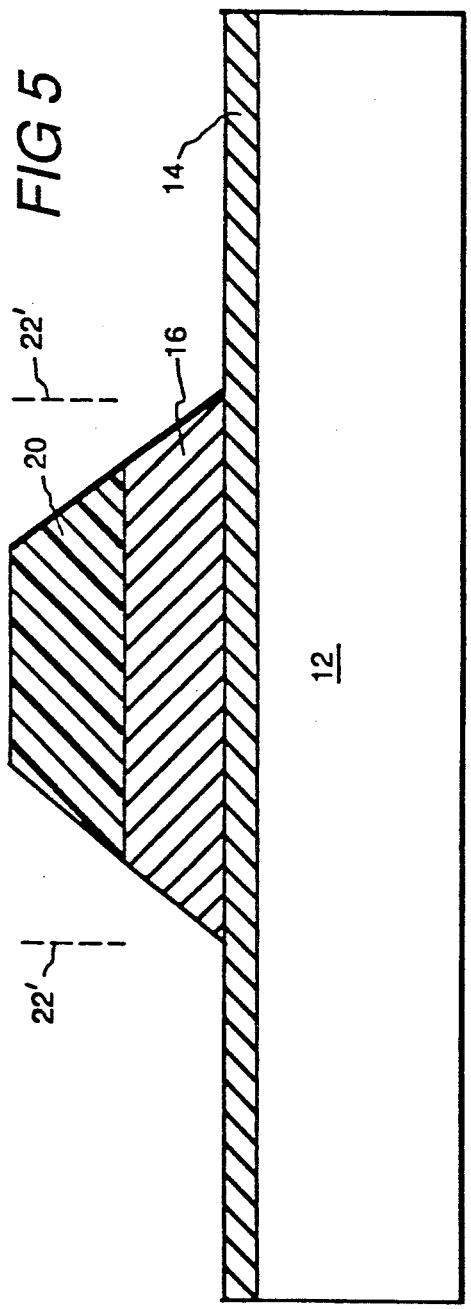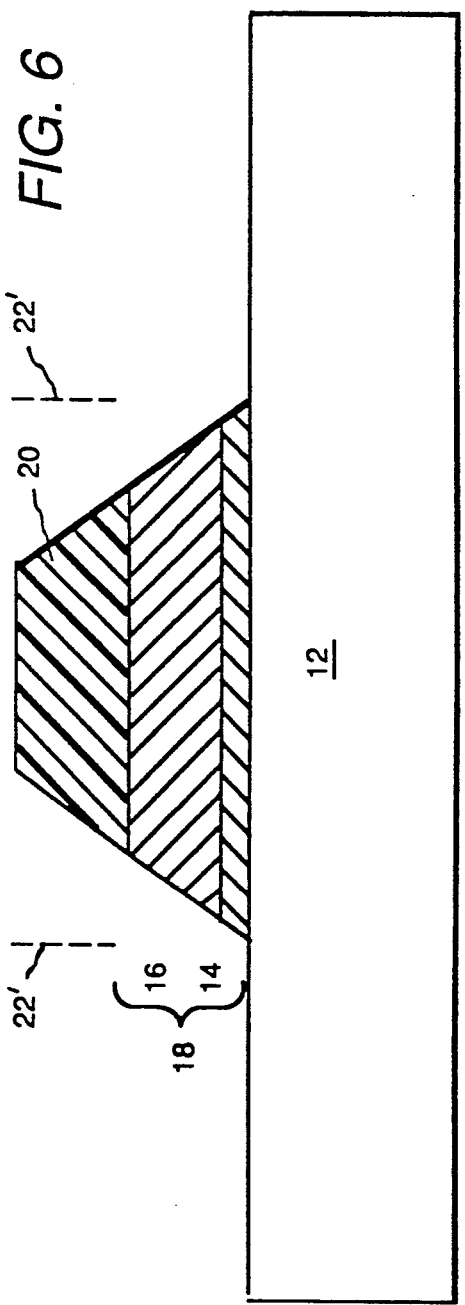

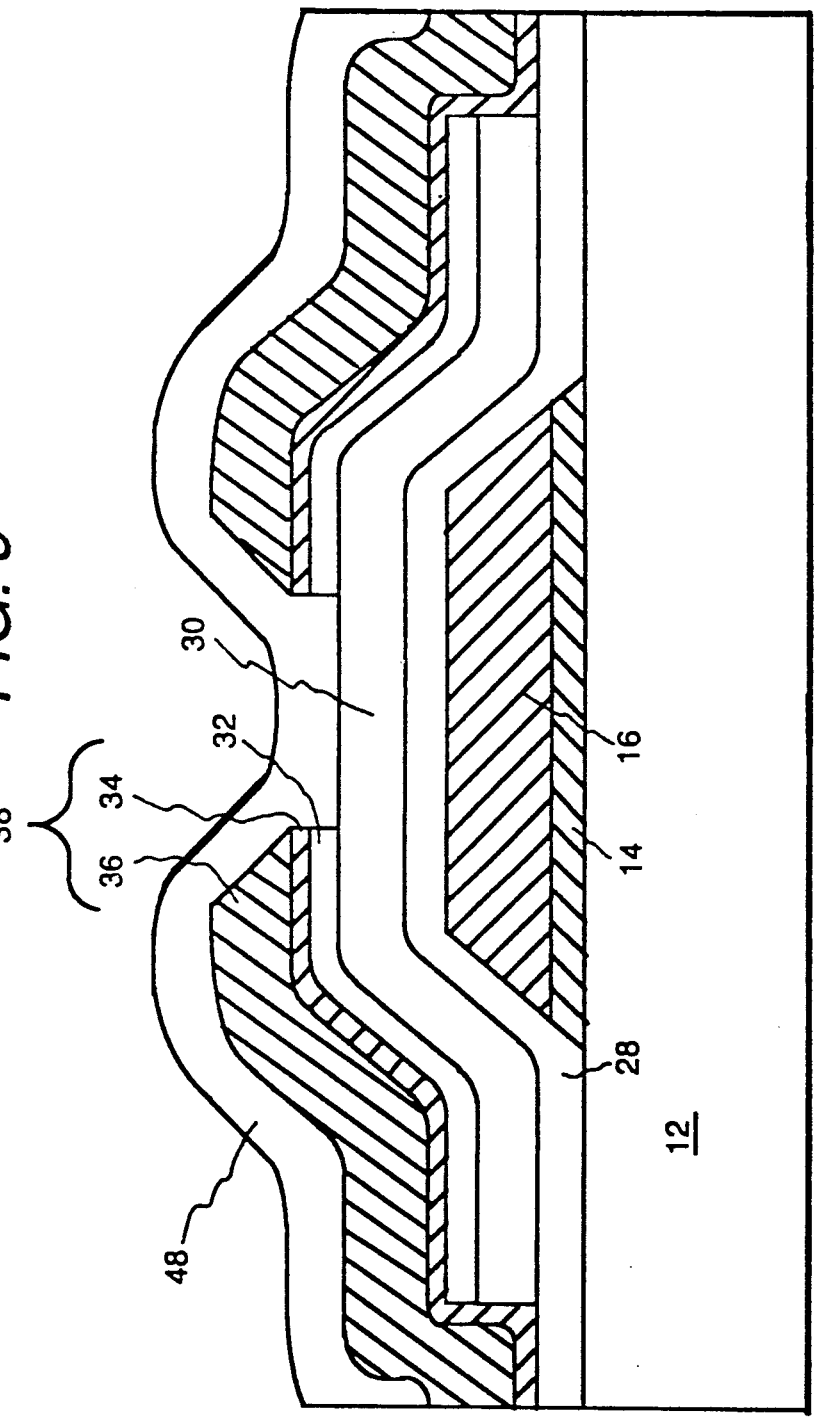

THIN FILM TRANSISTOR HAVING AN IMPROVED GATE STRUCTURE AND GATE COVERAGE BY THE GATE DIELECTRIC

This application is a continuation of application Ser. No. 07/593,421, filed Oct. 5, 1990 now abandoned.

RELATED APPLICATIONS

The present application is related to application Ser. No. 07/593,419, filed Oct. 5, 1990, entitled, "Thin Film Transistor Structure With Improved Source/Drain Contacts", by R. F. Kwasnick, et al.; application Ser. No. 07/593,425, filed Oct. 5, 1990, entitled "Device Self-Alignment by Propagation of a Reference Structure's Topography", by C-Y Wei, et al.; application Ser. No. 07/593,423, filed Oct. 5, 1990, entitled, "Positive Control of the Source/Drain-Gate Overlap in Self-Aligned TFTs Via a Top Hat Gate Electrode Configuration", by C-Y Wei, et al.; application Ser. No. 07/510,767, filed Apr. 17, 1990, entitled "Method for Photolithographically Forming a Self-Aligned Mask Using Back Side Exposure and a Non-Specular Reflecting Layer", by G. E. Possin, et al.; and application Ser. No. 07/499,733, filed Mar. 21, 1990, entitled "Method for Fabricating a Self-Aligned Thin-Film Transistor Utilizing Planarization and Back-Side Photoresist Exposure", by G. E. Possin, et al., filed Mar. 21, 1990, each of which is incorporated herein by reference.

BACKGROUND OF THE INVENTION

1. Field of the Invention

The present invention relates to the field of thin film transistors and more particularly to the field of thin film transistor metallizations.

2. Background Information

Amorphous silicon (a-Si) thin film transistors (TFT's) are widely used in display and imager applications where arrays of small display elements or arrays of small sensor elements are densely packed utilizing the ability to fabricate thin film transistors on large area non-crystalline substrates. An inverted thin film transistor is a thin film transistor in which the gate metallization is disposed on the substrate, the gate dielectric is disposed on top of the gate metallization and adjacent portions of the substrate, the amorphous semiconductor material is disposed on top of the gate dielectric and the source/drain metallization is disposed on the amorphous semiconductor material. This structure is referred to as inverted because it is up-side-down relative to the structure of a typical field effect transistor (FET) fabricated in a body of monocrystalline semiconductor material—a structure which was also used for early thin film transistors.

Two different gate metallizations are preferred in prior art thin film transistors. These are titanium alone and a first layer of titanium with a second layer of molybdenum disposed thereon. The two layer Mo/Ti electrode structure is used in those applications where higher conductivity than that provided by titanium alone is required.

One of the reasons for the use of titanium as the gate dielectric material is that titanium provides excellent adhesion to most substrate materials. In particular, typical substrates are either glass or coated with silicon dioxide. Titanium provides excellent adherence to both these materials. In the fabrication of a typical prior art thin film transistor, the titanium of the gate electrode is deposited on the substrate by sputtering or other appropriate processes. Thereafter, if molybdenum is to be included in the gate electrode, the molybdenum is deposited on the titanium, preferably without breaking vacuum in the deposition apparatus. A photoresist layer is then formed over the gate metallization, the photoresist is patterned and the gate metallization is etched down to the substrate. Either wet or dry etchants may be used.

However, we have found that where dry etching such as reactive ion etching is employed, excessive gate to gate leakage results from residual titanium which the dry etching process does not remove. A brief wet etch in dilute HF after the completion of the dry etching of the gate pattern will remove this residual titanium from the substrate surface. This wet etching step is required even if the dry etching step has included overetching which etches into the silicon dioxide or glass of the substrate. This is apparently because of the tenacious nature of titanium oxide which results in an inability of the dry etching process to remove all the titanium. Where a dry etching process is employed which provides a slope on the side walls of the gate metallization, this subsequent wet etching step converts the relatively smoothly sloped sidewall of the gate metallization into a bumpy sidewall having a bumpiness on the scale of the titanium thickness and thus in the range of 500–4000Å. As a consequence of this bumpiness, subsequently deposited dielectric layers have reduced or impaired integrity because the bumpiness of the sidewall results in uneven deposition of the dielectric layer thereover and may even result in voids, pinholes and gaps in that subsequently deposited layer. A further problem is prevention of etching of the substrate during patterning of the gate metallization. This carries with it the disadvantage that the height of the gate topography is increased as well as having the disadvantage of removing underlying silicon dioxide. Where the substrate itself is not glass, this underlying silicon dioxide is typically intentionally included in the structure to form a barrier between other portions of the substrate and the thin film transistor. Increasing the topography of the gate metallization (i.e. a greater difference between the level of the top of the gate metallization and the level of the surface on which it is disposed) increases the difficulty of producing adequate step coverage of the gate dielectric which is deposited subsequently. Even worse, the excessive removing of the underlying silicon dioxide could result in a reentry sidewall structure which is much more difficult for the subsequently deposited gate dielectric to cover adequately. Consequently, such removal of the silicon dioxide is a significant disadvantage.

An improved gate electrode structure and fabrication process is needed which results in smoothly sloping sidewalls on the gate metallization and eliminates or substantially reduces etching of the underlying substrate.

OBJECTS OF THE INVENTION

Accordingly, a primary object of the present invention is to provide an improved thin film transistor structure whose gate metallization has smoothly sloping sidewalls for producing adequate step coverage by a high integrity gate dielectric passivation layer.

Another object of the present invention is to provide an improved method of fabricating and patterning the gate metallization of an inverted thin film transistor which results in a gate metallization having smoothly sloped sidewalls and which substantially eliminates substrate etching which provides for improved step coverage of subsequently deposited layers over the gate metal, in particular the source/drain metallization which crosses over the gate metal in array configurations.

SUMMARY OF THE INVENTION

The above and other objects which will become apparent from the specification as a whole, including the drawings, are obtained in accordance with the present invention by employing a two-conductor gate metallization in which an initial thin layer of a first conductor is provided and a subsequent substantially thicker layer of a second conductor is deposited on the first conductor, with the second conductor being one which can be etched by an etchant to which the second conductor is substantially immune. The second conductor is preferably etched with a sloped sidewall to facilitate the deposition of high integrity dielectric layers over the gate metallization and the exposed portion of the substrate. The first, relatively thin gate conductor, may preferably be chromium and the second, relatively thick gate conductor, may preferably be molybdenum.

In accordance with one method of fabricating such a thin film transistor, a substrate is provided, the first thin conductor layer is deposited on the substrate preferably by sputtering; the second relatively thick conductor layer is deposited on the first conductor layer, preferably by sputtering; a photoresist layer is deposited on top of the second conductor and the photoresist layer is patterned in accordance with the desired gate conductor pattern. The second conductor is then preferably dry etched using reactive ion etching with source gases which etch the second conductor at a much faster rate than they etch the first conductor (a combination of $SF_6$, $Cl_2$ and $O_2$ for Mo/Cr metallization). With use of such a etching technique, the second conductor may be overetched to ensure the complete removal of that second conductor from the surface of the first conductor in the openings in the photoresist layer. The much slower etching rate of the first conductor than the second conductor in the etching medium allows this overetching to take place without adverse affect on the final device structure since substantially none of the first conductor is etched during this overetching. Next, preferably without breaking vacuum in the dry etching apparatus, the source gases are changed to gases which etch the first conductor at a useful rate (a combination of $Cl_2$ and $O_2$ for Cr metallization). It is preferable that these source gases be ones which provide no significant etching of the substrate. However, due to the extremely thin nature of the first conductor layer, an etchant may be employed for etching the first conductor which does in fact also etch the substrate without causing substantial adverse effects so long as the etching is terminated promptly upon completion of the etching of the first conductor material.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1-9 illustrate successive stages in the fabrication of a thin film transistor in accordance with the present invention.

DETAILED DESCRIPTION

Figure 1:
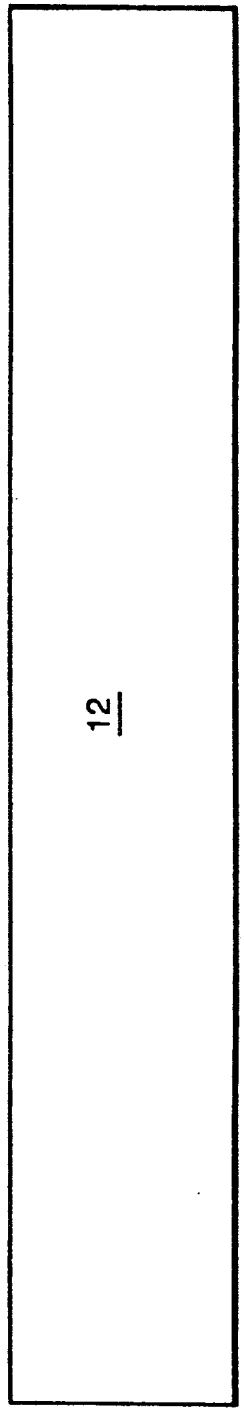
Figure 2:
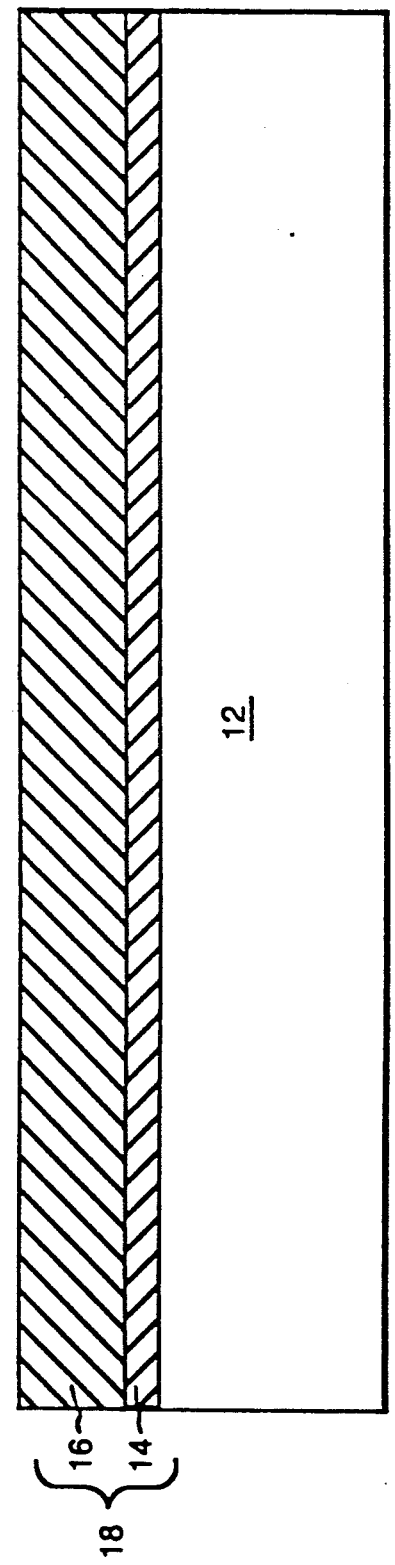

In FIG. 1, a portion of a substrate 12 on which an array of thin film transistors is to be fabricated is illustrated in cross-section. The process of fabricating a thin film transistor in accordance with the present invention begins by depositing a first relatively thin layer 14 of a first conductor material (chromium) on the substrate 12. This is followed by the deposition of a second relatively thick layer 16 of a second conductor material (molybdenum) on top of the first conductor layer 14. The layers 14 and 16 together comprise the gate metallization 18 (FIG. 2). Thereafter, a layer of photoresist 20 is deposited on top of the second conductor layer 16 (FIG. 3). This photoresist layer is photolithographically patterned to provide an opening 22 surrounding the retained portion of the photoresist layer 20 (FIG. 4). The retained portion of the photoresist layer has a sidewall slope of about 45° and has the configuration desired for the gate metallization in the structure being fabricated. The upper surface of the second conductor 16 is exposed in the openings 22.

Next, the structure is dry etched preferably using reactive ion etching to pattern the upper conductor layer 16 in accordance with the retained photoresist pattern. To do this, the wafer is mounted in a reactive ion etching apparatus which is then purged and evacuated in accordance with normal reactive ion etching procedures. A source gas flow of preferably 37.5 sccm (standard cubic centimeters per minute) of sulphur hexafluoride ($SF_6$), 6.5 sccm of $Cl_2$ and 16 sccm of $O_2$ is established, introduced into the etching chamber at a pressure of 65 mtorr and a reactive ion etching potentials are applied to etch the molybdenum in the open regions 22. This molybdenum etching step is preferably carried out at a power of 200 watts. This etching is preferably carried out until all the molybdenum is removed in center of the openings 22 and is allowed to proceed for an addition 10% of the etch time to ensure that all of the molybdenum is removed from within the originally defined openings 22.

Following this etching step, the structure appears as illustrated in FIG. 5. It will be noted, that the second conductor (molybdenum) has been removed from the structure everywhere outside the region which was initially protected by the retained portion of the photoresist 20. The original edges of the retained photoresist are indicated by the dash lines marked 22' but the photoresist has been etched back from that original edge as the etching of the molybdenum has proceeded. This results in the substantially 45° slope to the side walls of the molybdenum as illustrated in FIG. 5.

Next, the etching gas is preferably changed to 70 sccm of $Cl_2$ and 30 sccm of $O_2$ at a pressure of 100 mtorr to remove the exposed chromium. This etching step is preferably carried out at a power of 300 watts. This etch is preferably continued until all the exposed chromium appears to have been removed and is then continued for an additional 60 seconds to ensure complete removal of the exposed chromium. The degree of overetching which should be employed depends on the substrate composition and the relative etch rates of the first conductor 14 and the substrate in the etching composition employed. Following this step, the structure appears as illustrated in FIG. 6.

Figure 7:
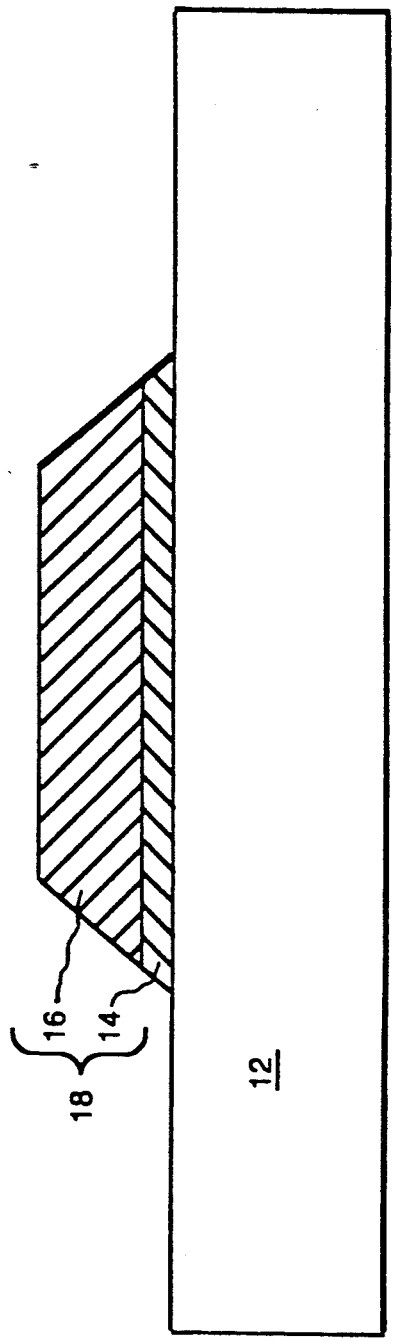

The retained photoresist is then removed to leave the structure illustrated in FIG. 7.

Figure 8:
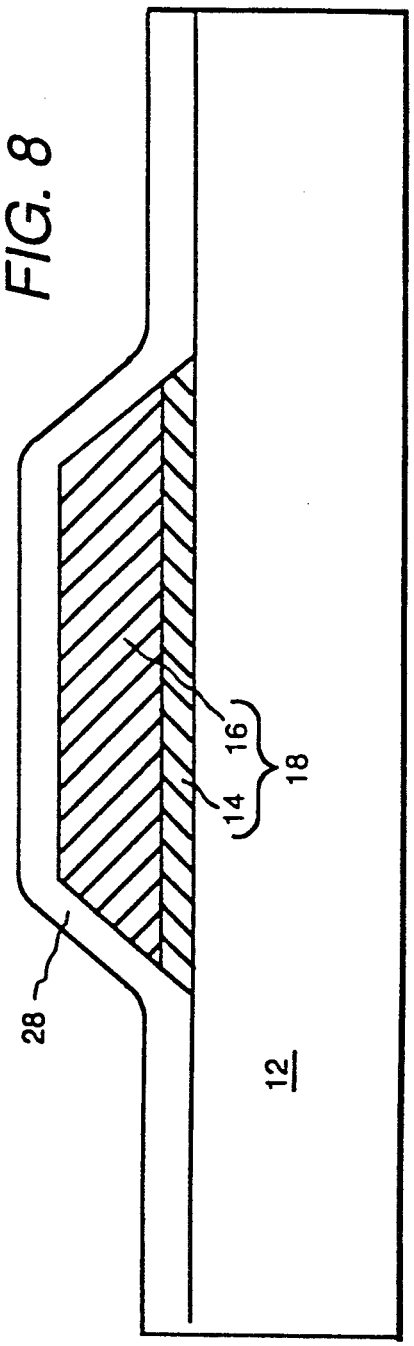

Next, a gate dielectric layer 28 is deposited over the entire structure preferably by chemical vapor deposition or some other process which is known to produce a high integrity dielectric. The structure at this stage of the process is shown in FIG. 8. This gate dielectric is preferably silicon nitride but may be silicon dioxide or other dielectrics. The chromium layer 14 is sufficiently thin (10 to 1000Å) and the sidewall of the molybdenum 16 is sufficiently sloped that a high integrity conformal dielectric layer results. Once this stage is reached, the fabrication of the thin film transistor may proceed in a manner well-known in the art with the deposition of intrinsic amorphous silicon 30 followed by the deposition of n+ amorphous silicon 32 without breaking vacuum in the deposition apparatus after the dielectric deposition. We prefer to provide a ~500Å molybdenum cap on the silicon to protect its quality during the subsequent etching of the silicon. This cap may then be removed.

The amorphous silicon is then patterned to restrict it to the areas desired for the thin film transistors. This is followed by deposition of the source/drain metallization 38, patterning of the source/drain metallization and the deposition of a back channel passivation layer 48. In accordance with related application Ser. No. 07/593,419 the source/drain metallization 38 may preferably be a two-layer metallization comprising a first relatively thin layer 34 of chromium and a second relatively thick layer 36 of molybdenum as is explained in more detail in that related application. At the end of the process, the transistor 10 appears as illustrated in FIG. 9.

While the gate metallization layer combination of chromium with an overlying layer of the molybdenum is preferred, other conductor pairs may be employed so long as the first conductor can satisfactorily serve as the etch stop for the etching of the second conductor and the first conductor can be sufficiently selectively etched with respect to the underlying substrate material that adverse affects are not produced.

While the present invention has been illustrated and described in terms of inverted thin film transistors, it should be understood that the use of this technique is not limited to inverted thin film transistors, but is also applicable to non-inverted thin film transistors.

Typically, the illustrated thin film transistor is only one of many such thin film transistors which are simultaneously fabricated on the same substrate.

While the semiconductor material in the just described embodiment is amorphous silicon, since that is the material presently in typical use for thin film transistors, it should be understood that this process is equally applicable to the use of other semiconductor materials or other forms of silicon. Other semiconductor materials which are presently used in an amorphous condition are germanium and cadmium selenide. This process technique is applicable to those amorphous silicon semiconductor materials and any others as well as being applicable to polycrystalline or even monocrystalline semiconductor materials where the underlying support structure supports the formation of such semiconductor layers. Further, while the gate dielectric layer has been described as being silicon nitride, it will be understood that more than one sublayer may be present in the gate dielectric layer and various sublayers may have different compositions and a single layer dielectric may be $SiO_2$ or other dielectric materials.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A thin film transistor comprising:
   a substrate;
   gate metallization disposed on said substrate, said gate metallization comprising a first relatively thin layer of a first conductor and a second relatively thick layer of a second conductor, said second conductor being etchable in an etchant to which said first conductor is substantially immune, said second conductor having sloped, dry etched sidewalls with a substantially uniform slope;
   wherein said first conductor comprises chromium and said second conductor comprises molybdenum;
   a gate dielectric disposed on said gate metallization, said gate dielectric forming a high integrity insulative layer over said slope of said second conductive layer gate metallization;
   semiconductor material disposed on said gate dielectric; and
   source and drain metallization disposed on said semiconductor material.

2. The thin film transistor recited in claim 1 wherein:
   said first conductor has substantially uniformly sloped, dry etched sidewalls.

3. The thin film transistor recited in claim 1 wherein:
   said semiconductor material is silicon.

4. The thin film transistor recited in claim 1 wherein:
   said semiconductor material is amorphous silicon.

5. The thin film transistor recited in claim 1 further comprising:
   a layer of passivation material disposed on said source and drain metallization.

* * * * *